United States Patent
Lewis et al.

(10) Patent No.: US 7,298,495 B2
(45) Date of Patent: Nov. 20, 2007

(54) SYSTEM AND METHOD FOR POSITIONING AN OBJECT THROUGH USE OF A ROTATING LASER METROLOGY SYSTEM

(76) Inventors: George C. Lewis, 103 Horse Pond Rd., Sudbury, MA (US) 01776; Zelimir Krokar, 88 Brush Hill Rd., Sherborn, MA (US) 01770

(*) Notice: Subject to any disclaimer, the term of this patent is extended or adjusted under 35 U.S.C. 154(b) by 179 days.

(21) Appl. No.: 11/167,006

(22) Filed: Jun. 23, 2005

(65) Prior Publication Data

US 2007/0023684 A1    Feb. 1, 2007

(51) Int. Cl.
*G01B 9/02*   (2006.01)

(52) U.S. Cl. .................................................. 356/500

(58) Field of Classification Search ............... 356/486, 356/487, 493, 498, 500
See application file for complete search history.

(56) References Cited

U.S. PATENT DOCUMENTS

| 4,572,021 | A |   | 2/1986  | Guarracini et al. |
| 4,627,009 | A |   | 12/1986 | Holmes et al. |
| 4,655,594 | A | * | 4/1987  | Wittekoek et al. ......... 356/500 |
| 5,734,164 | A |   | 3/1998  | Sanford |
| 6,403,968 | B1 |  | 6/2002  | Hazaki et al. |
| 6,407,373 | B1 | * | 6/2002 | Dotan ..................... 250/201.3 |
| 6,661,009 | B1 |  | 12/2003 | Groholski et al. |
| 6,855,940 | B2 | * | 2/2005 | Mutou .................... 250/440.11 |
| 2002/0093663 | A1 | * | 7/2002 | Tsai ........................... 356/498 |
| 2002/0180159 | A1 | * | 12/2002 | Nakamura et al. .......... 277/500 |

FOREIGN PATENT DOCUMENTS

| GB | 1275577  | 5/1972 |
| GB | 1458778  | 12/1976 |

\* cited by examiner

*Primary Examiner*—Samuel A. Turner
(74) *Attorney, Agent, or Firm*—Hamilton, Brook, Smith & Reynolds, P.C.

(57) ABSTRACT

A motion system includes a first stage that is configured to rotate about a first axis and a second stage coupled to the first stage that includes an object carrier adapted to position an object in at least one other axis. The motion system has a novel arrangement of laser interferometer elements and axes of motion. The arrangement permits accurate and precise measurement of a position of the object carrier in up to three (or more) axes of motion even as the first stage of the motion system is tilted through relatively large angles. The novel arrangement of the axes of motion also enables very precise control of the position of the object carrier even at high tilt angles.

25 Claims, 8 Drawing Sheets

SYSTEM AND METHOD FOR POSITIONING AN OBJECT THROUGH USE OF A ROTATING LASER METROLOGY SYSTEM

BACKGROUND OF THE INVENTION

FIG. 1 shows a typical electron beam or ion beam system. A vacuum chamber 1 contains a multi-axis motion system 2 which is used to position an object 3, such as a semiconductor wafer, under a beam 4 so that one or more sites of interest on the object 3 may be examined or processed. A column 5 on top of the vacuum chamber 1 provides an electron beam or ion beam. Generally, an electron beam is used to scan, observe, and measure features at sites of interest on the object 3. Focused ion beams (FIB) may be used to observe and repair features. Electron, laser, or ion beams can be used to control processes, such as removal or deposition of material(s), at sites of interest on the object 3. In some designs, two or more columns are used on one vacuum chamber, such as an electron beam system for observing defects and a separate FIB column for repairing defects.

A common arrangement in such motion systems is to have a tilting stage 6 on top of a rotating stage 7, on top of a Y-axis stage 8, on top of an X-axis stage 9. When a large variety of object thicknesses must be managed, a Z-axis of motion stage 10 is also included in the multi-axis motion system 2. The stacked arrangement in such a multi-axis motion system 2 limits accuracy of measurement(s) that can be obtained.

Often stepper motor drives are used to move the stages in their respective axes. A count of steps taken is used to effect approximate navigation. Then, the user must search in X, Y, and Z for each site of interest. After these adjustments are made, the object 3 may be tilted by using the tilting stage 6 to gain better access to lower layers at each site of interest.

Tilting the object 3 without moving the site of interest is not a simple task. Electron beam and FIB systems have limited viewing space. Most motion systems that provide a tilting motion quickly move the site of interest outside the viewing space. This problem is generally due to mechanical tolerances. Sometimes it is due to an inferior arrangement of the axes of motion. It is also a challenge to properly align the axis of beam 4 with the axes of motion in the multi-axis motion system 2.

The system in FIG. 1 often limits the size of object that can be moved, observed, or processed. Generally, a small object, broken from an original full-sized object, is all that can be placed on such a motion system 2. This limits use of the system to analytical tasks, since the broken piece often cannot be returned to the manufacturing line.

Electron, laser, or ion beam columns may be used in conjunction with one or more fixed gas jets 11 to remove or deposit material at each site of interest on an object. While it is possible to refocus the beam 4 over short distances, it is impractical to move gas jets 11.

A more robust motion system is needed. Users need to handle complete objects, without breaking them, and to navigate quickly and accurately to each site of interest. They need to do this when the object 3 has been tilted through an arbitrary angle, to navigate accurately in tilted space without the need for constant adjustment of the electron beam, laser beam, ion beam, or gas jets.

SUMMARY OF THE INVENTION

The principles of the present invention address the aforementioned and other problems associated with the motion system described in reference to FIG. 1. In accordance with the principles of the present invention, a novel arrangement of laser interferometer elements and axes of motion permits accurate and precise measurement of position of an object carrier on a second stage in up to three (or more) axes of linear motion even as a first stage, to which the second stage is coupled, is tilted through relatively large angles. The novel arrangement also enables very precise control of the second stage even at high tilt angles.

Accordingly, a system or corresponding method employing the principles of the present invention may be used for positioning an object. The system includes a structural support member to which a first stage is coupled through at least one rotational element. The first stage also includes a frame coupled to the at least one rotational element operable to rotate about a first axis through use of the at least one rotational element. The system also includes at least one second stage coupled to the first stage. The at least one second stage includes an object carrier adapted to move an object in at least a second axis. The system also includes a laser metrology system configured (i) to direct a laser beam in a direction substantially on and parallel to the first axis and (ii) to measure a position of the object carrier.

The laser metrology system may be configured to direct the laser beam through the structural support member. The at least one second stage may include an X-stage and a Y-stage, in which case, the laser metrology system includes optical elements that direct the laser beam to measure a position of the object carrier in respective X- and Y-axes. The system may further include at least one Z-control mechanism that moves the first stage in a Z-axis direction, in which case the laser metrology system is adapted to direct the laser beam in a direction substantially on and parallel to the first axis for all first stage positions on the Z-axis.

The aggregate center of gravity of the first stage and the second stage is within 1 inch of the first axis. In a preferred embodiment, the aggregate center of gravity is substantially on the first axis. Positioning the aggregate center of gravity in such proximity to the first axis provides balance to the system, which allows for reduced control requirements, smaller motors than for unbalanced systems, and other advantages understood in the art.

In one embodiment, the first stage includes a first rotational element and a second rotational element. The first rotational element may be fixedly coupled to the structural support member, and the second rotational element may be variably coupled to the structural support member. In both one and multiple rotational element embodiments, the first stage may be adapted to rotate greater than one degree. The system may further include an immobilization mechanism coupled to the first stage to restrict motion (e.g., rotation or vibration) of the first stage.

The system may also include an alignment sensor adapted to detect an orientation of the object on the object carrier.

In some embodiments, the system further includes at least one motion control processor coupled to the second stage that causes the second stage to move in a desired manner. In such embodiments, the at least one motion control processor receives feedback of the position of the object carrier from the laser metrology system. The system may further include at least one other metrology system to measure a position of the object carrier or object, in which case the at least one motion control processor receives feedback from the at least one other metrology system for use in controlling the position of the object carrier or object.

The system may be used in an electron scanning microscope, vacuum chamber, ion beam repair or diagnostic system, or automated manufacturing process. For example, the system can be used with high resolution electron beam or ion beam systems to improve viewing and measurement capabilities. It may also be used with electron, laser, or ion beam systems to manufacture or repair objects such as integrated circuits, masks, nano-imprint molds, nano-devices or MEMS devices.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
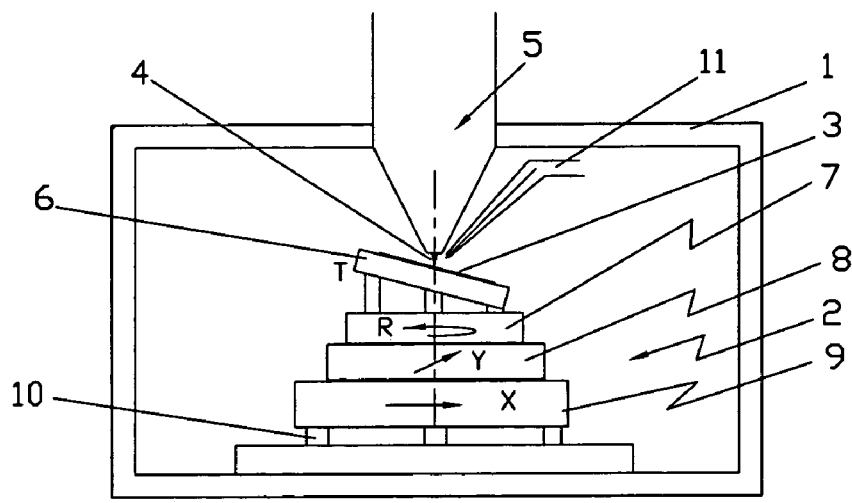
FIG. 1 is a vertical section diagram of a prior art multi-axis motion system used to position a wafer, for example, in an electron, ion, or laser column or in front of a fixed gas jet provided to deliver process chemicals.
Figure 2:
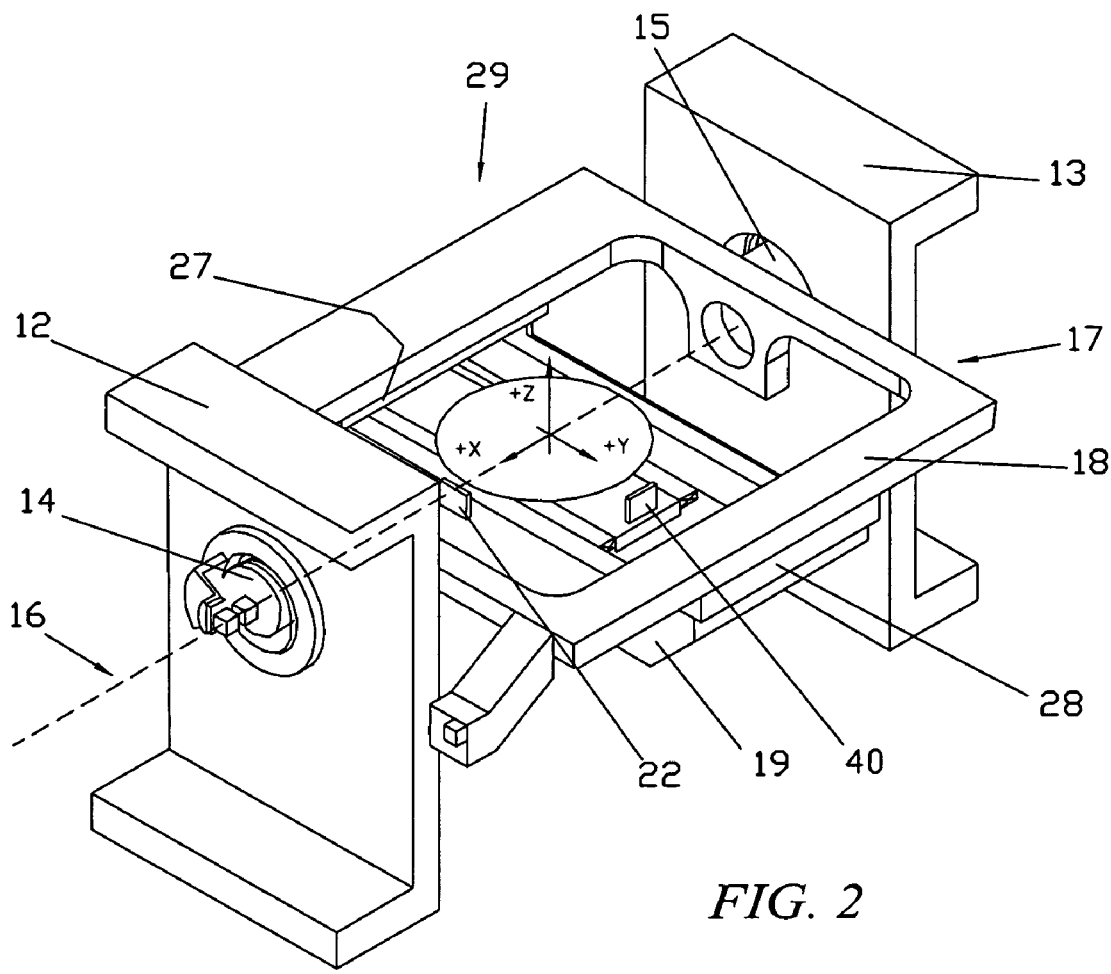
FIG. 2 is a perspective view of a multi-axis motion system, according to the principles of the present invention, with coordinate conventions as viewed from the rear, right side.

FIG. 2 is a diagram of a motion system 29 according to the principles of the present invention. A right structural support member 12 and a left structural support member 13 have within them a right rotational element 14 and a left rotational element 15, respectively. These two rotational elements 14 and 15 define one axis of rotation, the first (tilt) axis 16. The first axis 16 carries a first stage 17, which includes a first stage frame 18 attached to the rotational elements 14 and 15.

In a preferred embodiment, the first stage frame 18 is attached to inner races (not shown) of spindle ball bearings by means well known in the art. It should be understood that other designs, such as gas bearings, roller bearings, crossed flexures, or other low friction rotational elements, can be used. But, the use of spindle ball bearings has other advantages as explained below in reference to FIG. 15.

Figure 12:
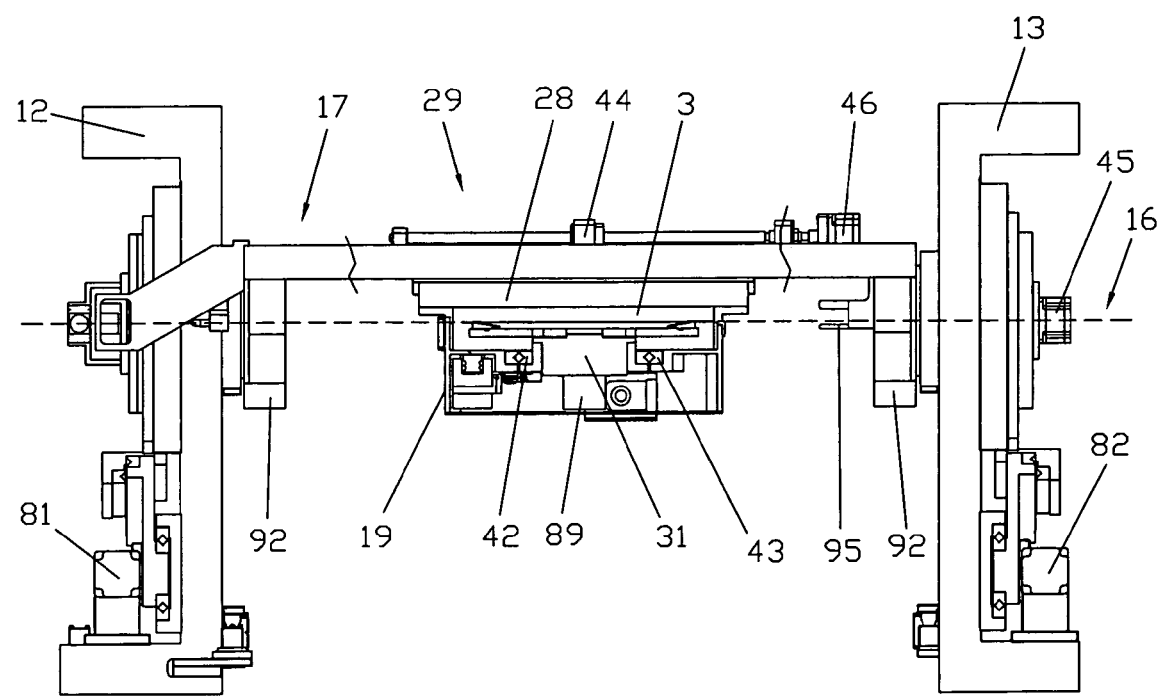
FIG. 12 is a vertical section view through the first (tilt) axis, viewed from the rear, indicating an arrangement of masses used to place an aggregate center of gravity on the first axis indicated in FIG. 3.

Referring briefly to FIG. 12, a first axis drive motor 45 is attached to the first stage 17 to drive the first stage in rotation about the first (tilt) axis 16. While a design using two supports is described herein, it should be understood that, in some applications, a cantilevered design using just one support member 12 and just one rotational element 14 can work equally well.

Referring again to FIG. 2, a second (X) stage 19 is coupled to the first stage 17 using crossed roller bearings. A front roller bearing 27 is mounted to the first stage 17 at the front of the first stage frame 18. A rear roller bearing 28 is mounted to the first stage 17 at the rear of the first stage frame 18. These two roller bearings 27 and 28 are aligned by well known methods so that the second stage 19 moves parallel to the first axis 16 along a second (X) axis 26.

Figure 8:
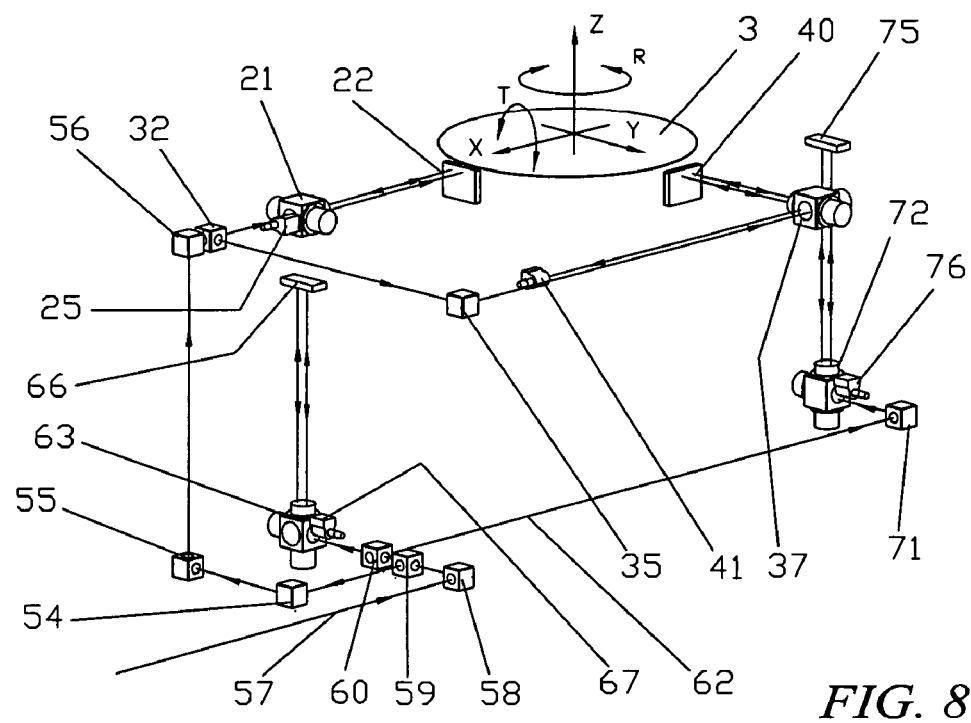
FIG. 8 is a perspective view from the right rear of the multi-axis motion system of FIG. 2 showing the arrangement of laser parts and beams in one embodiment.
Figure 9:
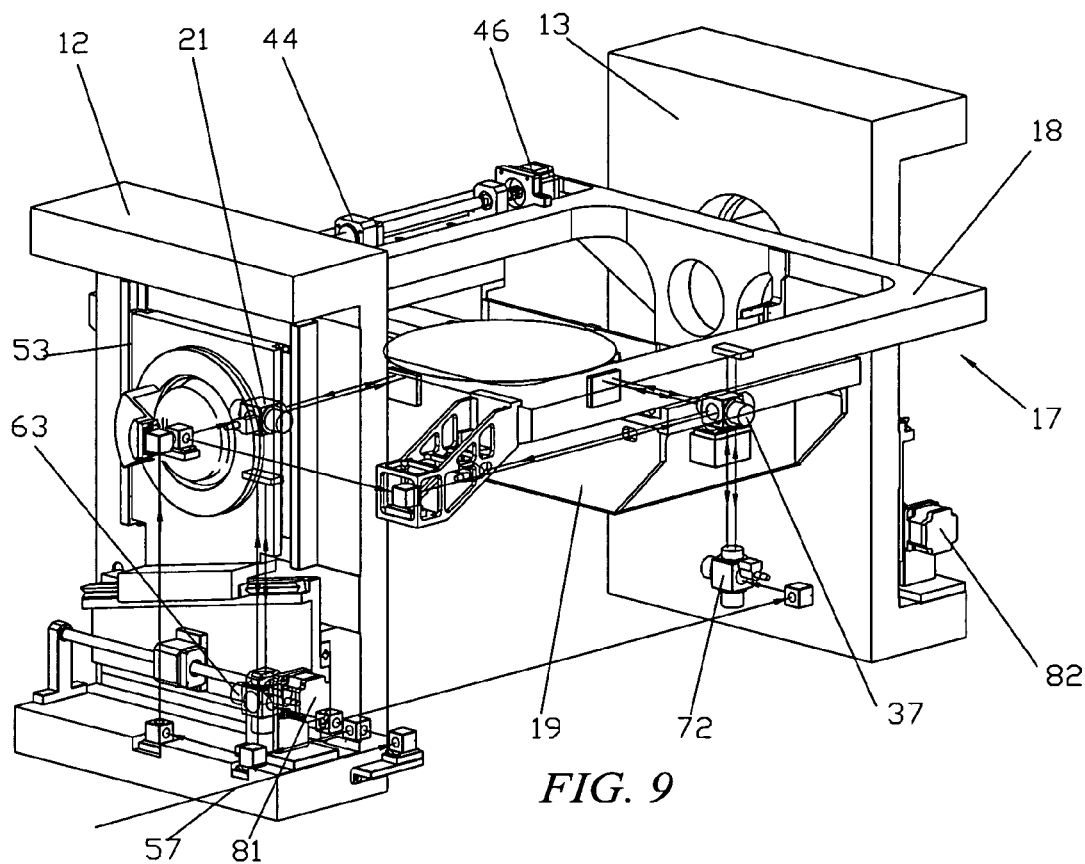
FIG. 9 is a detailed perspective view of the motion system of FIG. 2 showing relationships among the various laser parts and beams and their related mechanical parts to provide one integrated view with the related laser parts.

Referring briefly to FIG. 9, a second axis drive motor 46 may be mounted to the first stage frame 18 of the first stage 17. Acting through a conventional ball screw drive and first ball nut 44, the second axis drive motor 46 moves the ball nut 44. The ball nut 44 is attached to the second stage 19. In this manner, the second drive motor 46 moves the second stage 19 in a controlled manner. Referring again to FIG. 2, plane (i.e., flat) mirror 22 may be associated with the second stage 19 and used as part of a laser measurement system to control the motion of the second stage 19, as described below in reference to FIGS. 3, 4, and 8.

It should be understood that other low friction bearing elements, such as ball bearings or gas bearings, can be used to couple the second stage 19 to the first stage 17 in a manner that permits motion of the second stage 19 in the second (X) axis 26. The assignment of coordinate systems is shown in FIG. 2. It should be understood that this nomenclature is easily changed, so it is quite arbitrary.

Figure 3:
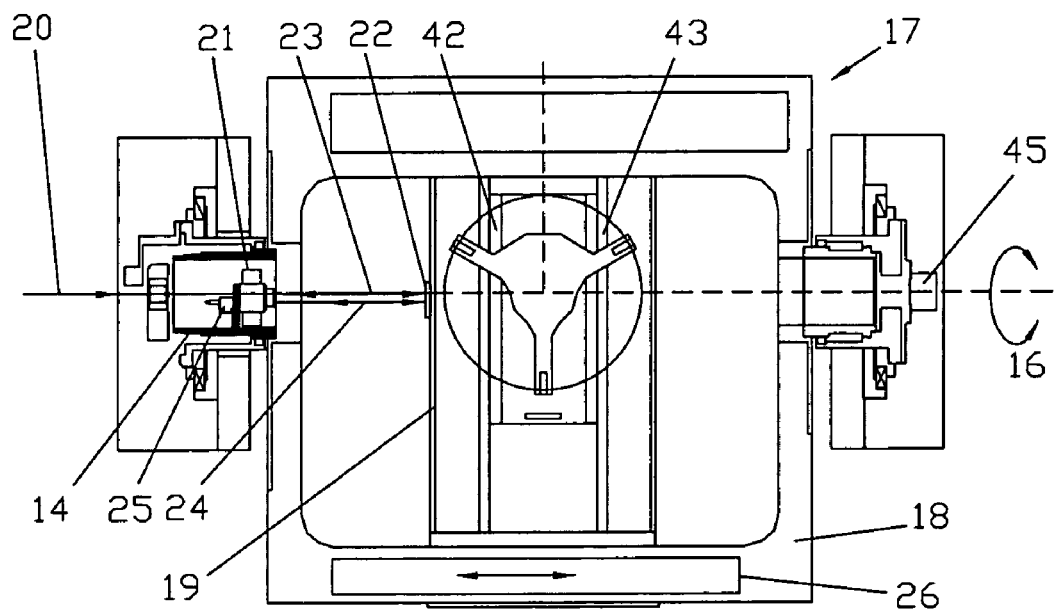
FIG. 3 is a horizontal section view at a plane of a first (tilt) axis showing the first stage, which rotates about the first axis, and an arrangement of a first laser interferometer and first laser beam used to add a second (X) axis of motion, which is a first axis of laser metered motion.

A unique feature of this invention is an arrangement of a laser interferometer in a manner that permits measurement of linear motion over long distances while the first axis 16 is rotated through large angles. FIG. 3 shows this unique arrangement. A first laser beam 20 is aligned to be parallel to and on the first axis 16 by means which are explained below in reference to FIG. 5. The first laser beam 20 passes through a first laser interferometer 21 and then on to a plane mirror 22, which is adjustably attached to the second stage 19 by well known means. The laser and interferometer may be commercial items supplied by Hewlett Packard or Zygo Corporation. The first laser interferometer 21 may be adjustably attached using well known means to an inside structure of the right rotational element 14. The first laser interferometer 21 may adjusted by well known methods so that a first measurement beam 23 exits parallel to the first axis 16. When the first laser interferometer 21 is properly aligned, the first measurement beam 23 exits the first laser interferometer 21 offset from the first axis 16 by about ⅛ inch, in one embodiment, but still parallel to the first axis 16. The internal operation of this first laser interferometer 21 is well described by its commercial supplier.

The first measurement beam 23 is reflected off the plane mirror 22. The plane mirror 22 may be adjusted using well known methods so that the reflected beam returns along the same axis, again parallel to first axis 16. The first measurement beam 23 makes several reflections inside the first laser interferometer 21, then exits again as a second measurement beam 24, again parallel to and offset from the first axis 16. The second measurement beam 24 is also reflected by the plane mirror 22 so that it returns along the same axis back to the first laser interferometer 21. In this manner, the plane mirror 22 is set perpendicular to the first axis 16. Finally, the first laser beam 20 exits the first laser interferometer 21 and passes into a first optical fiber receiver 25. The well known operation of first laser interferometer 21 causes the first and second measurement beams 23 and 24 to generate a measurement signal that is captured by the first optical fiber receiver 25. This measurement signal is converted to position and velocity data by control electronics (not shown), which may be supplied by Hewlett Packard or Zygo.

In the arrangement just described, the first stage 17 can be rotated around the first axis 16 without causing any loss of signal and without introducing false detection of motion of the second stage 19 in the second axis 26.

While a unique arrangement of the mechanical parts, laser parts, and laser beams has been shown passing through right structural support member 12 and right rotational element 14, other similar arrangements are possible. For example, a mirror image arrangement of the parts and beams using the left structural support member 13 and left rotational element 15 can work equally well.

Figure 4:
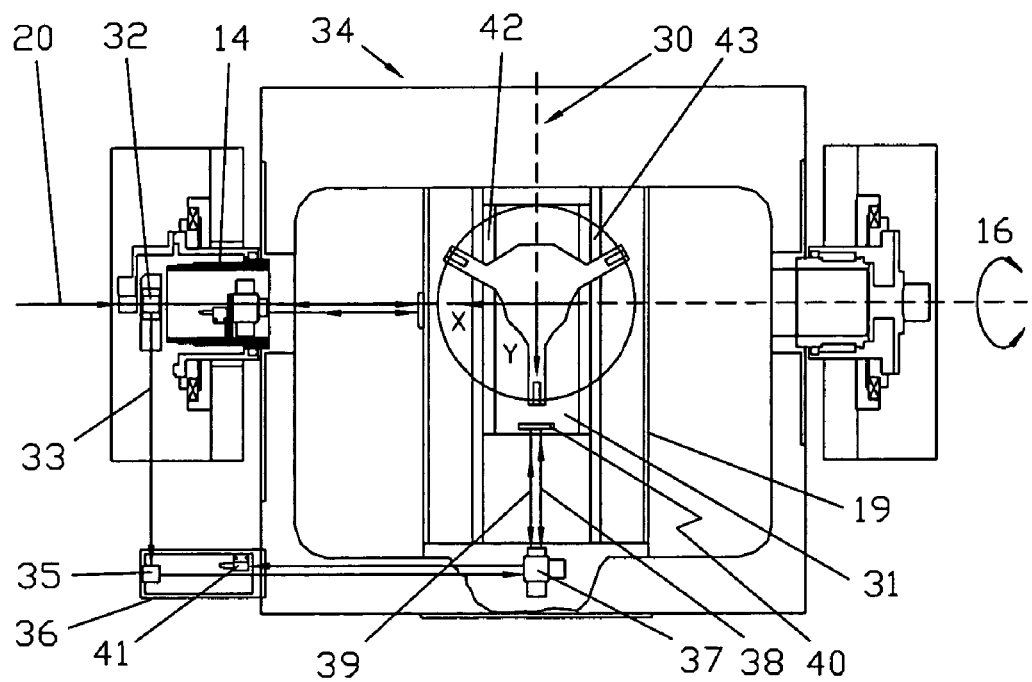
FIG. 4 is a horizontal section view, similar to FIG. 3, that shows an arrangement of a second laser interferometer and a second laser beam used to add a third (Y) axis of motion, which is a second axis of laser metered motion.

FIG. 4 shows how a third (Y) axis 30 is added to the first and second axes 16 and 26 described above. The third (Y) stage 31 may be coupled to the second stage 19 using crossed roller bearings 42 and 43 mounted at the right and left sides, respectively, of the second stage 19 and the third stage 31. The crossed roller bearings 42 and 43 may be adjusted by well known methods so that the third stage 31 moves along the third axis 30 in a direction that is perpendicular to the second axis 26. It should be understood that other low friction bearing elements, such as ball bearings or gas bearings, can be used to couple the third stage 31 to the second stage 19 in a manner that permits motion of the third stage 31 in the third axis 30.

As is shown in FIG. 4, a first 50:50 beam splitter 32 is placed on the first axis 16 so that half of the intensity of first laser beam 20 is diverted in a new direction parallel to the third axis 30 and referred to as a second laser beam 33. The first 50:50 beam splitter 32 may be adjustably mounted on the right rotational element 14 by well known means. When the first 50:50 beam splitter 32 is adjusted properly, the second laser beam 33 exits perpendicular to the first axis 16. Since the first laser beam 20 is already aligned to be on and parallel to the first axis 16, the relationship between the first laser beam 20 and the second laser beam 33 does not change as the first stage 17 rotates through its full range of travel about the first (tilt) axis 16. In fact, the first laser beam 20 and the second laser beam 33 define a plane 34 that includes the first axis 16 and is parallel to and above the third axis 30.

As shown in FIG. 4, the second laser beam 33 is next turned by a first 90° beam bender 35. The first 90° beam bender 35 is adjustably mounted to the first stage frame 18 by a beam bender support 36. The first 90° beam bender 35 may be adjusted by well known methods to turn the second laser beam 33 through a 90° angle and keep it in the plane 34 defined above. The second laser beam 33 then passes on to a second laser interferometer 37. The second laser interferometer 37 may be assembled using well known methods so that third and forth measurement beams 38 and 39, respectively, exit at a 90° angle to the incoming second laser beam 33. The second laser interferometer 37 may be adjustably mounted to the second (X) stage 19 by well known means. The second laser interferometer 37 may be adjusted by well known methods so that the third measurement beam 38 exits in the plane 34 and parallel to the third (Y) axis 30. A plane mirror 40 may be adjustably mounted to the third (Y) stage 31 by well known means. The plane mirror 40 may be adjusted using well known methods so that both the third and fourth measurement beams 38 and 39 return along their respective axes and parallel to the third axis 30. After the fourth measurement beam 39 returns to the second laser interferometer 37, it is deflected through a 90° angle and returns to a second optical fiber receiver 41 as a measurement signal. This measurement signal may be converted to position and velocity data by control electronics (not shown), which may be supplied by Hewlett Packard or Zygo.

This arrangement of first and second laser beams 20 and 33, beam splitter 32, beam bender 35, interferometers 21 and 37, and plane mirrors 22 and 40 with respect to the three axes 16, 26, and 30 enables accurate laser measurement of the linear motion of the second (X) axis 26 and third (Y) axis 30 through a full range of travel of the first (tilt) axis 16 without loss of signal or false motion detection.

Figure 5A:
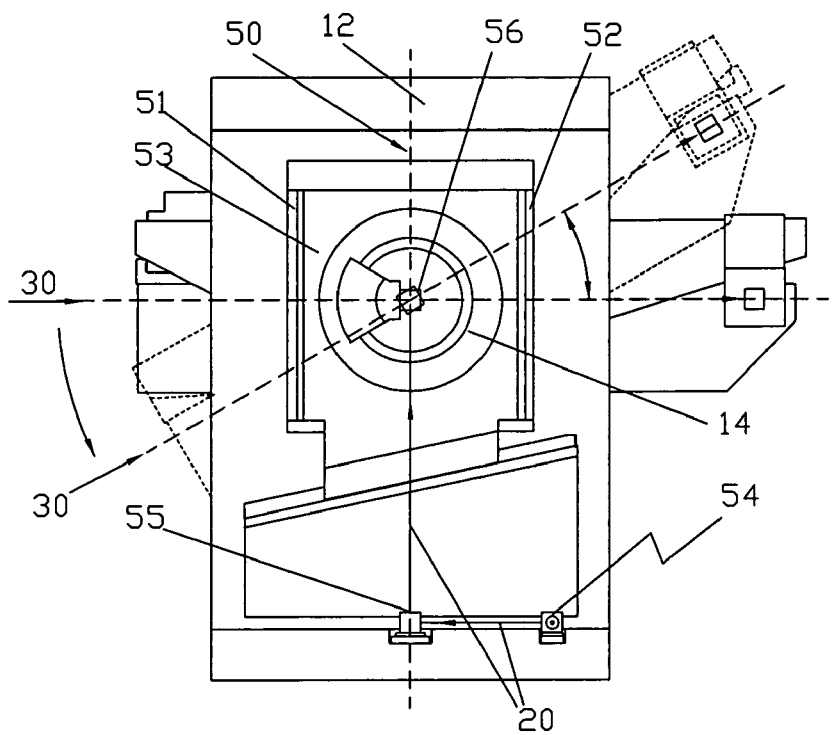
FIG. 5A is a vertical view of the outside of a right structural support member, supporting the multi-axis motion system of FIG. 2, showing how the first laser beam is delivered to the first (tilt) axis of motion.

FIGS. 5A, 5B, 6 and 7 show how a fourth (Z) axis of motion 50 is added to the above system. As shown in FIG. 5A, the fourth axis of motion 50 is provided by crossed roller bearings 51 and 52 mounted to the right structural support member 12 and a fourth (Z) stage 53. The crossed roller bearings 51 and 52 may be adjusted by well known methods so that the fourth axis of motion 50 is perpendicular to the first axis 16 and perpendicular to the plane 34 when the plane 34 is in a horizontal position. The fourth stage 53 may carry a right rotational element 14. In this manner, the fourth axis of motion 50 can move the right rotational element 14 in a vertical axis. It should be understood that other low friction bearing elements, such as ball bearings, flexures or gas bearings, can be used to couple the fourth stage 53 to the right structural support member 12 in a manner that permits motion of the fourth stage 53, as described above.

As shown in FIG. 5A, the first laser beam 20 exits through the right structural support member 12 at the second 90° beam bender 54, which may be adjustably attached to right structural support member 12 by well known means. The second 90° beam bender 54 may be adjusted by well known methods so that it directs the first laser beam 20 to a third 90° beam bender 55. The third 90° beam bender 55 may be adjustably attached to the right structural support member 12 by well known means. The third 90° beam bender 55 may be adjusted by well known methods so that the first laser beam 20 exits the third 90° beam bender 55 both parallel to a fourth (Z) axis 50 and directly through the first (tilt) axis 16. In this manner, the fourth (Z) axis of motion 50, which carries the right rotational element 14, may be moved vertically while keeping the first laser beam 20 on the first axis 16. A fourth 90° beam bender 56 may be adjustably attached by well known means to the fourth stage 53. The fourth 90° beam bender 56 may be adjusted by well known methods so that the first laser beam 20 exits the fourth 900 beam bender 56 on and parallel to the first axis 16. In this manner, the arrangement of beams and components described earlier is maintained even when the fourth (Z) axis of motion 50 is added to the system.

Figure 5B:
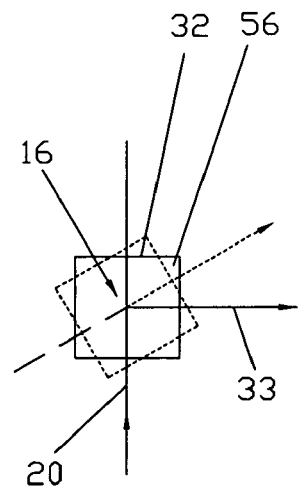
FIG. 5B is an enlarged view of a beam bender used to direct the first laser beam on and parallel to the first axis of motion as shown in FIG. 5A.

FIG. 5B is an enlarged view that shows the first laser beam 20 coming from below, parallel to the fourth (Z) axis 50, entering the fourth 90° beam bender 56, where it is bent through a 90° angle to emerge on and parallel to the first (tilt) axis 16, as described above. The fourth 90° beam bender 56 may be adjustably attached to the fourth (Z) stage 53, so that it moves in the fourth axis 50 but does not rotate when the first axis 16 is moved. Shown in dashed lines in FIG. 5B is also the first 50:50 beam splitter 32, which is behind the fourth 90° beam bender 56 in this view. The first 50:50 beam splitter 32 is shown rotated around the first axis 16 by an arbitrary angle. The second laser beam 33 is also shown exiting from the first 50:50 beam bender parallel to the third (Y) axis 30, as described above. In this manner, the needed beam relationships are set-up and maintained as each axis moves.

Figure 6:
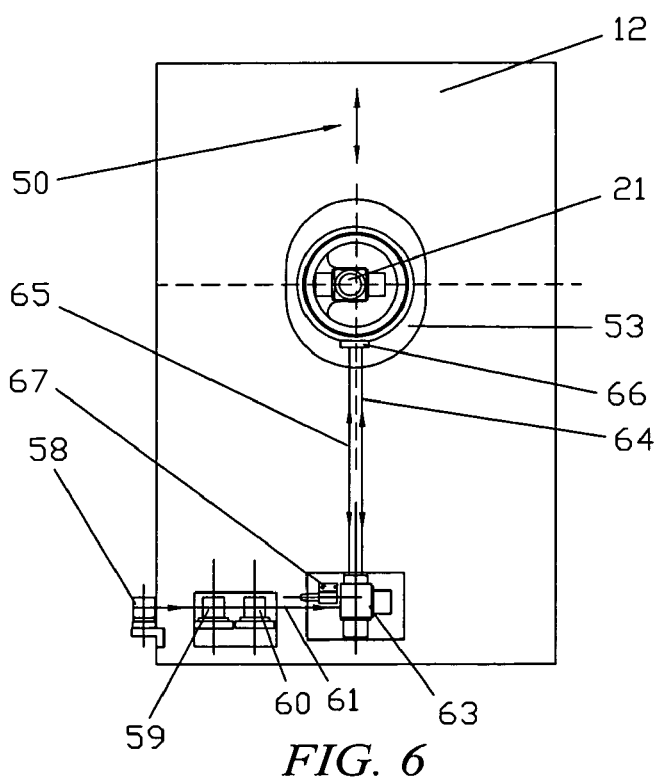
FIG. 6 is a vertical view of the inside of the right structural support member of FIG. 5A showing how an original (i.e., source) laser beam is divided to provide the first laser beam shown in FIGS. 3, 4, and 5, showing a further division of the laser beam that provides a third laser beam and third laser interferometer arranged to measure a fourth (Z) axis in a vertical motion provided within the right structural support member, and showing how a fourth laser beam is provided to measure a fifth (second Z) axis in a vertical motion for a left side structural support member.

As shown in FIG. 6, laser metering for the fourth (Z) axis 50 is provided on the inside of the right structural support member 12. An original (i.e., source) laser beam 57 (not shown here but discussed below in reference to FIGS. 8 and 9) enters the system from the right rear side. This beam 57 is turned 90° by a fifth 90° beam bender 58 so that the original laser beam 57 travels parallel to the inside surface of the right structural support member 12. A second 50:50 beam splitter 59 divides the original laser beam 57 into two equal strength beams. One of these beams is deflected through 90° and passes through the right structural support member 12 to become the first laser beam 20. The other beam passes through the second 50:50 beam splitter 59 and into a third 50:50 beam splitter 60. The third 50:50 beam splitter 60 divides the beam into two equal strength beams. A third laser beam 61 exits parallel to the inside surface of right structural support member 12. A fourth laser beam 62 (see FIG. 8) exits horizontally and at 90° to the third laser beam 61.

The third laser beam 61 passes on to a third laser interferometer 63. The third laser interferometer 63 may be assembled using well known methods so that the fifth and sixth measurement beams 64 and 65 exit at a 90° angle to the incoming third laser beam 61. The third laser interferometer 63 may be adjustably attached to an inside base of the right structural support member 12 by well known means. The third laser interferometer 63 may be adjusted by well known methods so that the fifth measurement beam 64 exits parallel to the fourth (Z) axis 50. A plane mirror 66 may be adjustably attached by well known means to the fourth stage 53, which extends through the right structural support member 12. The plane mirror 66 may be adjusted using well known methods so that both the fifth and sixth measurement beams 64 and 65 return along their respective axes and parallel to the fourth axis 50. After the sixth measurement beam 65 returns to the third laser interferometer 63, it is deflected through a 90° angle and returns to a third optical fiber receiver 67 as a measurement signal. This measurement signal may be converted to position and velocity data by control electronics (not shown), which may be supplied by Hewlett Packard or Zygo.

Figure 7:
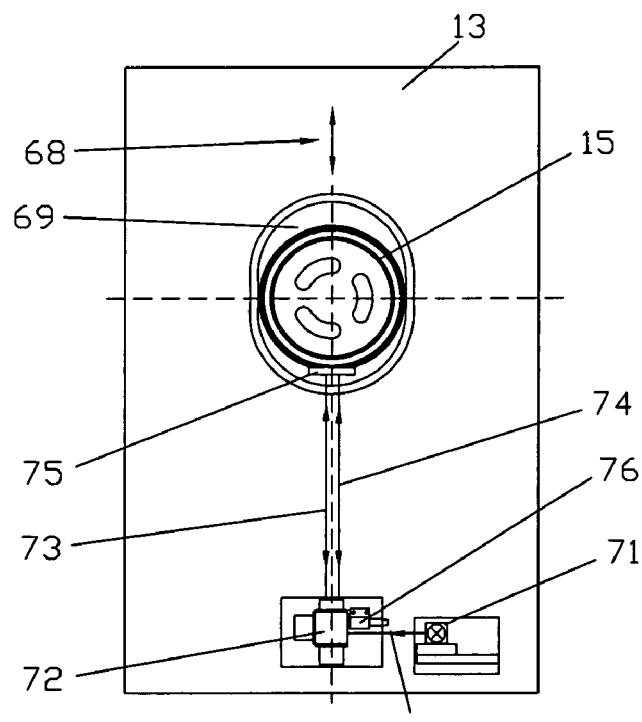
FIG. 7 is a vertical view of the inside of a left structural support member, supporting the multi-axis motion system of FIG. 2, showing how the fourth laser beam of FIG. 6 arrives and how it is used to provide the fourth laser interferometer to measure vertical (second Z) motion provided within the left structural support member.

The left structural support member 13 shown in FIG. 7 is a mirror image copy of the right structural support member 12. It has a fifth axis of motion 68, also referred to herein as the second (or left) Z-axis 68, and a fifth (second Z) stage 69, which are constructed and assembled as described above for the fourth (Z) axis of motion 50. Like the fourth axis of motion 50, the fifth axis of motion 68 may be set-up by well known methods to be perpendicular to the first axis 16 and perpendicular to the plane 34 described above, when the plane 34 is in a horizontal position. In this manner, the fourth axis 50 and the fifth axis 68 are also set parallel to each other. A fifth stage 69 may carry a left rotational element 15. In this manner, the left rotational element 15 may be moved in the fifth (second Z) axis of motion 68.

A fourth laser beam 62 passes horizontally across the base of the motion system 29 shown in FIG. 2 to the left structural support member 13, as shown in FIG. 7. A sixth 90° beam bender 71 turns the fourth laser beam 62 so that it passes parallel to the inside surface of the left structural support member 13 to a fourth laser interferometer 72. The fourth laser interferometer 72 may be assembled using well known methods so that seventh and eighth measurement beams 73 and 74 exit at a 90° angle to the incoming fourth laser beam 62. The fourth laser interferometer 72 may be adjustably attached to the inside base of the left structural support member 13 by well known means. The fourth laser interferometer 72 may be adjusted by well known methods so that the seventh measurement beam 73 exits parallel to the fifth (second Z) axis of motion 68. A plane mirror 75 may be adjustably attached by well known means to the fifth stage 69, which extends through the left structural support member 13. The plane mirror 75 may be adjusted using well known methods so that both seventh and eighth measurement beams 73 and 74 return along their respective axes and parallel to the fifth axis of motion 68. After the eighth measurement beam 74 returns to the fourth laser interferometer 72, it is deflected through a 90° angle and returns to a fourth optical fiber receiver 76 as a measurement signal. This measurement signal may be converted to position and velocity data by control electronics (not shown), which may be supplied by Hewlett Packard or Zygo.

FIG. 8 provides a perspective view of the full laser system just described. FIG. 9 shows most, but not all, of the laser system mounted on the multi-axis motion system 29 of FIG. 2. These drawings are provided to add clarity to the detailed description provided above. The incoming, original (i.e., source), laser beam 57, which has been mentioned but not shown in reference to prior presented figures, is shown in both FIGS. 8 and 9.

Measurement signals from the third laser interferometer 63 and the fourth laser interferometer 72 are used to provide feedback control to two independent drive motors, a fourth axis drive motor 81 and a fifth axis drive motor 82, which drive the fourth stage 53 and the fifth stage 69, respectively, using well known or custom servo-control methods. In this manner, the first axis 16 can be moved linearly in a vertical direction without disturbing the relationships established for the first laser beam 20, the fourth 90° beam bender 56, and the first axis 16. As a result, three linear (X, Y, and Z) axes of laser metered motion are provided throughout a full rotation of the first axis 16 and throughout a full range of linear travel in the second (X) axis 26, the third (Y) axis 30, and the fourth (first Z) and fifth (second Z) axes 50 and 68, which act together as one linear (Z) axis.

Figure 10:
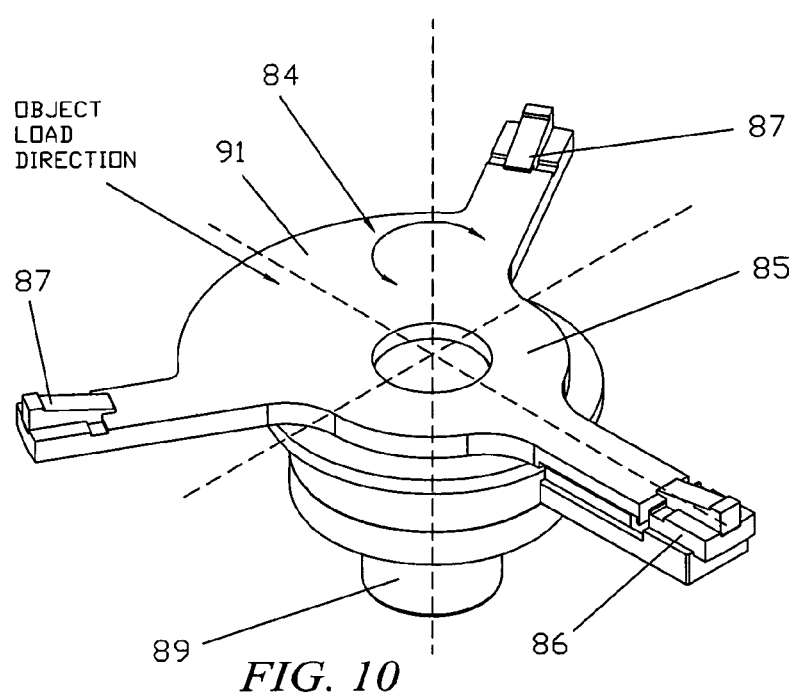
FIG. 10 is a perspective view of an object carrier and a sixth (object rotation) axis of motion in the multi-axis motion system of FIG. 2.

FIG. 10 shows a sixth axis of motion 84, also referred to herein as the object rotation axis 84, which may be mounted in the third (Y) stage 31. The sixth (object rotation) axis of motion 84 is set perpendicular to the first axis 16 and perpendicular to the plane 34. The sixth axis of motion 84 may carry an object carrier 85. In this embodiment, the object carrier 85 is set perpendicular to the sixth axis 84 and is therefore parallel to the plane 34. The sixth axis 84 can rotate through 360° of motion when driven by a sixth axis drive motor 89. The sixth axis drive motor 89 may be a commercial stepper motor or another type of motor. This motor 89 may be coupled to the object carrier 85 using commercially available drives, such as a harmonic reduction gear, drive parts, and rotary bearings. In this manner, the object 3, generally a silicon wafer, can be rotated into a desired orientation for observing, repairing, or otherwise processing sites of interest on the object 3.

In FIG. 10, the object carrier 85 is shown in a loading position. Well known robotic means may be used to move the object 3 to the object carrier 85. A sliding edge gripper 86 may be spring loaded. The sliding edge gripper 86 may be pushed towards the rear of the motion system 29 by a loading robot. As the loading robot withdraws, the object 3 is pressed against two fixed edge grippers 87 by a spring (not shown) in the sliding edge gripper 86. The edge grippers 86 and 87 can be designed using well known techniques to provide top, center, or bottom reference of the object 3 in the object carrier 85. Generally, a top reference is preferred. The reference surfaces (e.g., top reference) are set so that the object 3 is parallel to the plane 34. When top referencing is provided, the top surface is therefore in the plane 34 and on the first axis 16. This arrangement provides navigation benefits, which are further explained below in reference to FIG. 12.

Very accurate and fine control of the motion system 29 requires careful attention to an aggregate center of gravity of the full motion system 29. The aggregate center of gravity preferably remains on the first axis 16 as all motions move through their full ranges of travel. This arrangement provides the best possible control and the minimum possible vibration at all sites of interest. In some embodiments, the aggregate center of gravity is within a given tolerance (e.g., ±1 inch) of the first axis 16, but, as understood in the art, requires more power, more powerful motors, and more control than when the aggregate center of gravity is on the first axis 16. How the aggregate center of gravity can be designed to be on the first axis 16 in the preferred embodiment is described immediately below.

The object carrier 85 incorporates a counterbalance mass 91. The counterbalance mass 91 is designed to exactly offset the weight of the sliding edge gripper 86, so that the center of gravity of the object carrier 85 is on the center of the sixth axis of motion 84. This arrangement assures no motion of the center of gravity of this assembly as the sixth axis of motion 84 moves through its full range of travel.

Figure 11:
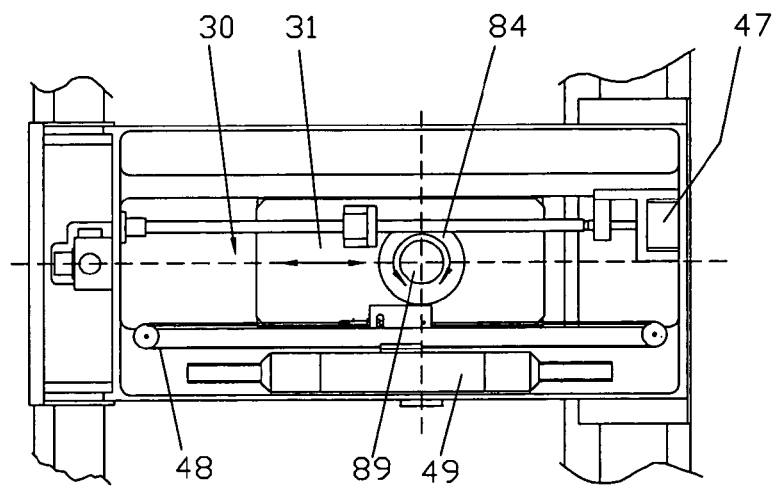
FIG. 11 is a bottom view of the third (Y) axis of motion in the multi-axis motion system of FIG. 2 showing an arrangement of a moving counterbalance to keep an aggregate center of gravity of this motion system and the parts it carries on the first axis throughout full travel of the third axis of motion.

FIG. 11 shows how a stationary center of gravity is maintained for the third (Y) axis of motion 30. As the third axis drive motor 47 moves the third (Y) stage 31, a cable 48 drives a counterweight 49 in the opposite direction of the third stage 31. The weight of counterweight 49 matches that of third stage 31 and all of the parts mounted thereon, such as the sixth (object rotation) axis of motion 84, object carrier 85, and object 3. In this manner, the aggregate center of gravity of the third axis of motion 30 remains stationary throughout its full range of travel.

FIG. 12 shows a relationship of all six axes of motion to the first axis 16 and shows that the aggregate center of gravity is in fact directly on the first axis 16. By placing the first stage 17 above the first axis 16, the center of gravity is first above the first axis 16. Then, the second axis 26, second stage 19, third axis 30, third stage 31, and sixth axis 84, including the sixth axis drive motor 89 and object carrier 85, are placed below the first axis 16. This arrangement lowers the aggregate center of gravity to be nearly on the first axis 16. A set of trim weights 92, which can be machined to the correct weight, are then added to the first stage 17 below the first axis 16 to achieve an exact coincidence of the aggregate center of gravity and the first axis 16.

Since the second (X) axis of motion 26 moves exactly parallel to the first axis 16, the aggregate center of gravity moves left or right with the second axis of motion 26, but remains on the first axis 16. This shift does not harm fine control of the motion system 29. The fourth (first Z) axis of motion 50 and fifth (second Z) axis of motion 68 are individually driven, as has been explained above. This arrangement of the vertical motion control enables fine control of the vertical position as the aggregate center of gravity moves slightly left and right of center.

Note also in FIG. 12 that the preferred embodiment places the top surface of the object 3 exactly on the first axis 16. This arrangement provides a eucentric motion system 29, namely one that holds the surface of the object 3 and all sites of interest on the surface of object 3 at a focal point of the column 5 as the first axis 16, second axis 26, third axis 30, and sixth axis 84 move through their full ranges of motion.

Figure 13:
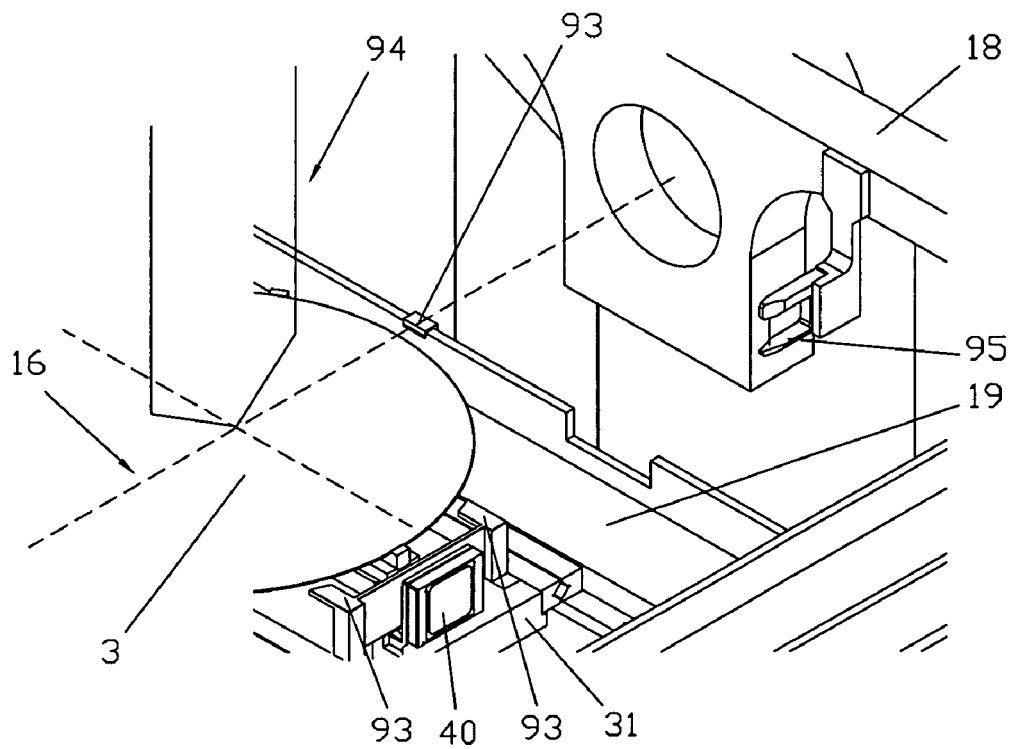
FIG. 13 is a diagram of an alignment sensor used in the multi-axis motion system of FIG. 2 to orient objects after loading and prior to observation and/or processing.

As shown in FIG. 13, calibration artifacts 93 are mounted on the second stage 19 and on the third stage 31 exactly at the height of the first axis 16. When the third axis 30 moves to a proper position, the calibration artifacts 93 can be directly on the first axis 16. The calibration artifacts 93 can then be used to set-up the focus of the column 5 or to verify that the focus is still set-up properly during use of the system. In this manner, proper synchronization of the column setup and the motion setup is achieved. Calibration artifacts 93 may also have detectable marks on their surfaces that can be used to establish a navigation origin for the second (X) axis 26 and third (Y) axis 30.

Many applications include another metrology system 94, such as an autofocus or height sensor. Initially, this can be synchronized to the setup height of the calibration artifacts 93. Thereafter, this sensor can be used to return the fourth (first Z) axis 50 and the fifth (second Z) axis 68 to the original setup height.

The other metrology system 94 can also be used to track sag of the object 3 and to command the fourth axis 50 and the fifth axis 68 to keep the top surface of object 3 at the focus point of the column 5. In this manner, very precise and accurate observation, repair, or other processing use can be performed even on unflat objects.

In FIG. 13, an alignment sensor 95 is shown attached to a side of the first stage frame 18 of the first stage 17. After loading a new object 3, the second axis of motion 26 and third axis of motion 30 move the object 3 to the alignment sensor 95. The alignment sensor 95 may be a notch finder, for example. In such cases, the sixth axis 84 rotates the object 3 slowly until the notch finder locates both edges of a notch that has been previously fabricated in the edge of the object 3 for use in orienting the object 3.

To align the notch, stepper motor counts from the sixth axis drive motor 89 may be tracked and recorded by the controller 115 (see FIG. 16) each edge of the notch. A center count for the notch center may be calculated by the controller 115. Using a priori data for the process being used, the object 3 can then be rotated to the proper orientation for observing, repairing, or otherwise processing sites of interest on the object 3.

Figure 14:
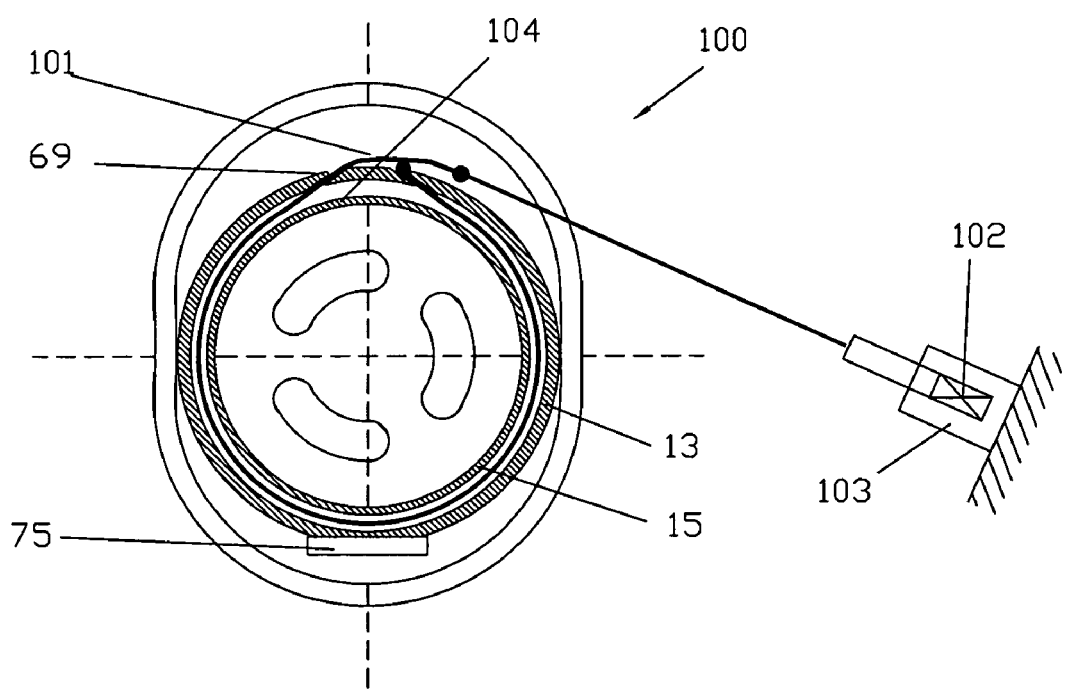
FIG. 14 is a vertical section view through a left rotational element, normal to the first axis, showing how the rotational elements on the first tilt stage of FIG. 2 can be immobilized.

For the preferred embodiment, it is anticipated that most use will involve frequent motion of the second (X) axis 26, the third (Y) axis 30, the fourth (first Z) axis 50 and the fifth (second Z) axis 68 (acting together as a single Z-axis), and the sixth (object rotation) axis 84. The first axis 16 will likely be moved infrequently and set. For example, during orientation and alignment of the object 3, rotation around the first axis 16 can be set so that the object 3 is horizontal, normal to the axis of column 5. Once the sites of interest (e.g., patterns) on the object 3 have been precisely located, the first stage 17 is moved to a predetermined (tilt) angle by the first axis drive motor 45. Once first stage 17 reaches a desired angle about the first axis 16, the first stage 17 may be gently clamped at this angle. Through use of this gentle clamping, navigation in the other axes is improved, and vibration is significantly reduced. For this purpose, referring to FIG. 14, immobilization mechanism(s) 100 are provided on both the right rotational element 14 and the left rotational element 15. As can be seen in FIG. 14, the immobilization mechanism(s) 100 have a belt 101 that wraps around a smooth surface 104. A spring 102 normally pulls the belt 101 tightly against the smooth surface 104 so that the rotation member 15 is gently immobilized. When the rotation member 15 is to be moved, a solenoid 103 is energized. The solenoid 103 is arranged so that its mechanical action compresses the spring 102 and releases the grip of the belt 101 on the smooth surface 104. In this manner, the rotation member 15 is made free to move (i.e., rotate for tilt).

While a single structural support member 12 and a single rotational element 14 can be used to define the first axis 16, the preferred embodiment incorporates both a right structural support member 12 and a left structural support member 13, as can be seen in FIG. 2 and in FIG. 9. In this case, it is useful to allow for expansion and contraction of a distance between the two structural support members 12 and 13 due to temperature changes. As a practical matter, some allowance for assembly errors and parts errors is also needed for this distance. The right rotational element 14 may be mounted in the right structural support member 12 so that it is fixed according to conventional mechanical design practice. But, the left rotational element 15 may be variably coupled to the left structural support member 13, as shown in FIG. 15.

Figure 15:
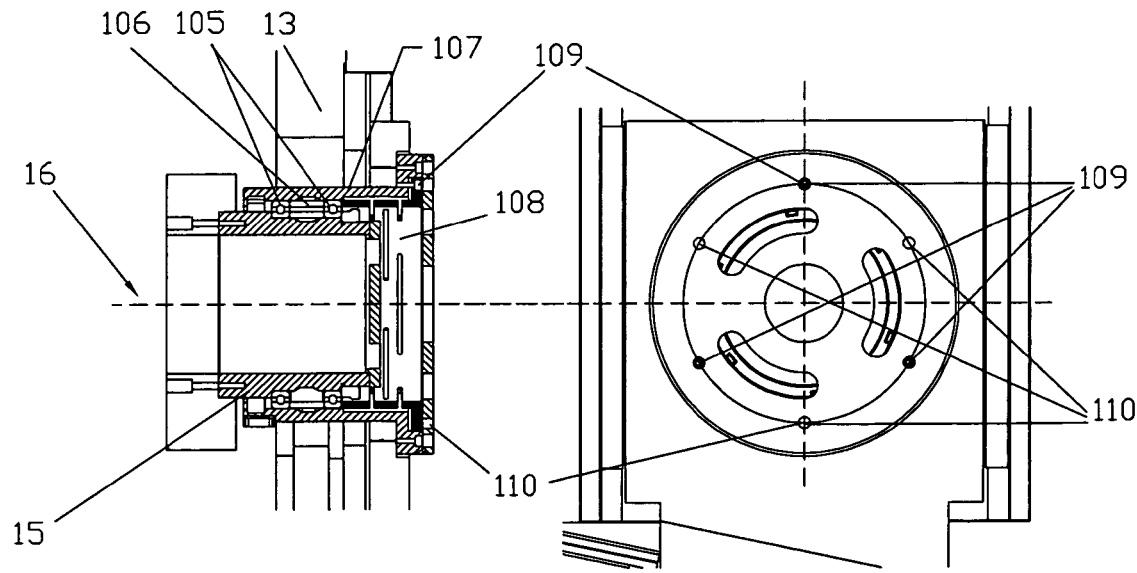
FIG. 15 is a vertical section through the left rotational element of FIG. 14 and on the first axis showing how the left rotational element is designed to be variably coupled to the left structural support member of FIG. 7.

FIG. 15 shows that two commercial ball bearings 105 separated by a spacer 106 may be allowed to move parallel to the first axis 16 a small distance inside a housing 107. In this embodiment, a precision radial flexure 108 presses against an outer race of ball bearings 105 with a variable force. Three adjustment screws 109 may be used to adjust this force. Three corresponding access holes 110 may be provided to measure a compression distance caused by adjusting the three screws 109. The relationship between compressed distance and force may be determined for the precision radial flexure 108 prior to assembly. By measuring the compression distance through the access holes 110 as the adjustment screws 109 are moved, the amount of force applied to the ball bearings 105 can be set to the desired amount. In this manner, the left rotational element 15 may be variably coupled to the left structural support member 13, and slight errors or changes in the distance between the two structural support members 12 and 13 can be accommodated.

It should be understood that, while ball bearings have been shown here, other forms of bearings, such as gas bearings, may also be used to provide a variable coupling of either rotational element to its respective structural support member. Similarly, other forms of the precision radial flexure 108 are possible, such as adjustable gas pressure or a set of properly arranged linear flexures.

The arrangement of parts and laser beams described above incorporates a useful design tradeoff. Best practice in most stage interferometer designs is to place the first interferometer 21 on the lower (inside) side of the vacuum chamber top plate and to place the plane mirror 22 on the object holder 85. In this manner, most errors in the mechanical structure and motions that are between the column 5 and the object 3 are measured directly. Similarly, the beam splitter 32 may be attached to the lower (inside) side of the vacuum chamber top plate to add an additional axis of stage interferometry. But, in this arrangement, the rotation of the first axis 16 quickly interrupts laser beams needed for stage interferometry. To make stage interferometry work with a large range of tilt motion, the novel arrangements of parts and laser beams described herein or their equivalents are employed.

The arrangements of parts and beams described herein does not measure some small motion errors that may occur and may need to be discovered and corrected in order to obtain more accurate navigation with the multi-axis motion system 29. For example, the first interferometer 21 measures motion of the second stage 19 in the second (X) axis 26. But, very small motions in the direction of the second (X) axis 26, due to axial runout in bearings in the right rotational element 14, are not measured, since the first interferometer 21 is attached to the first stage frame 18. Similarly, any very small motion(s) in the direction of the second (X) axis 26 due to small mechanical errors in the right crossed roller bearing 42 or in the left crossed roller bearing 43 are not detected because the plane mirror 22 is attached to the second stage 19, not to the object carrier 85. There are other similar tradeoffs which should be obvious to one skilled in metrology design.

To obtain more accurate navigation with the multi-axis system 29, two features of this invention are useful. First, bearings and drive trains are preferably preloaded so that random vibration or backlash motion is suppressed or not possible. Second, full counter-weighting of the motions, as has been described above, improves system control. As a result, motion of the multi axis motion system 29 is very repeatable and very stable. The repeatability and stability of the multi axis motion system 29 permits calibration and correction of the errors just described. The process used to carry out this calibration and correction is briefly described immediately below.

Using a very accurate wafer scanning tool or e-beam direct writing tool, a very accurate test pattern, such as a grid of alignment marks, may be generated on the object 3. When the patterned object 3 is placed on the object carrier 85, it can be measured by the beam and electronics associated with the column 5. A table of error corrections can be generated. Using well known methods, the table of error corrections may be used to improve the accuracy of the multi-axis motion system 29 to within the limit of its mechanical repeatability and short term stability. The methods of making such a calibration wafer or object 3, the methods of measuring it on the object carrier 85, and the methods of creating and using the table of error corrections are generally well known in the art. These three steps (making a calibration object, measuring a calibration object, and using the error data to correct navigation) used with the parts and laser beams described herein may be employed to obtain an improved navigation result.

Figure 16:
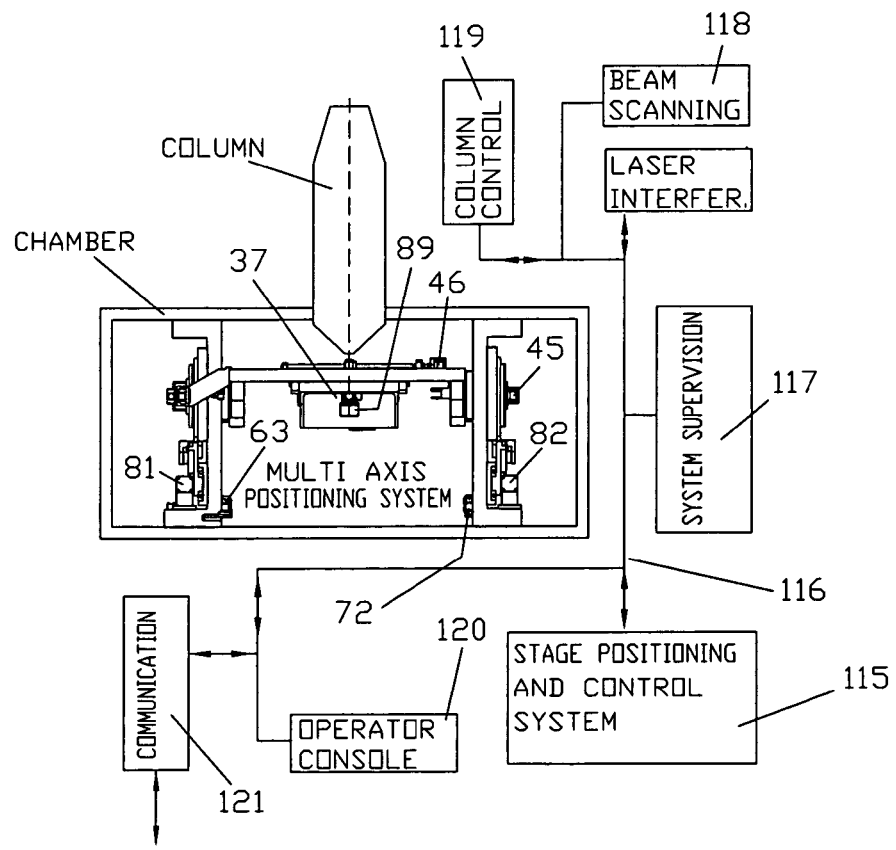
FIG. 16 is a system block diagram of example controls used to operate the multi-axis motion system of FIG. 2.

FIG. 16 shows a motion system controller 115 used to control motion of the object carrier 85 through use of the stages. The first axis 16 may use a drive motor 45 that may be a commercial precision stepper motor. The sixth (object rotation) axis 84 may use a sixth axis drive motor 89, which may also be a commercial precision stepper motor. For these two rotating axes, the controller 115 may use well known or custom methods to generate micro-stepping phased signals to move the first axis 16 and the sixth axis 84 in fine increments of angle. The number of steps moved is used to keep track of where each of these two axes is in its travel. In the preferred embodiment, directly coupled, commercial, harmonic drives are used to move these two axes of rotation. The controller 115 may include (i) the table of error corrections described above and (ii) the software to apply this table of error corrections to navigation of the multi-axis motion system 29. Hardware or firmware (not shown) separate from the controller 115 optionally in communication with the controller 115 may also be employed to implement the table of error corrections.

The second axis 26, third axis 30, fourth axis 50, and fifth axis 68 may all be driven by commercial precision stepper motors (motors 46, 47, 81, 82). For these four axes, the first laser interferometer 21, second laser interferometer 37, third laser interferometer 63, and fourth laser interferometer 72, respectively, are used to provide feedback to control motion of these axes. Motion control methods, such as single-input single-output (SISO) or multiple-input multiple-output (MIMO) feedback control techniques, may be used for these four axes of linear motion and are generally known by those skilled in the art of machine control. In the preferred embodiment, directly coupled, commercial, ball screws and ball nuts may be used to move these four axes of linear motion.

As was described above, the calibration artifact 93, the other metrology system 94 (e.g., a focus sensor), and the alignment sensor 95 (e.g., a notch finder) are also connected to the controller 115 so they may operate with other elements of the control system. Finally, the controller 115 has connections 116, such as internal Ethernet connections, to other control systems 117, such as (i) a host computer and/or the column control 119, which controls the vacuum system for the column 5, (ii) the beam scanning control 118, which controls the beam position within the column 5, or (iii) the Communications module 121, which provides links to a world of data outside this machine, for example in a factory or a remote service location.

While this invention has been particularly shown and described with references to preferred embodiments thereof, it will be understood by those skilled in the art that various changes in form and details may be made therein without departing from the scope of the invention encompassed by the appended claims.

What is claimed is:

1. A system for positioning an object, comprising:
a structural support member;
a first stage including (i) at least one rotational element coupled to the structural support member and (ii) a frame coupled to the at least one rotational element operable to rotate about a first axis through use of the at least one rotational element;
a second stage coupled to the first stage, the second stage having an object carrier adapted to move an object in a second axis; and
a laser metrology system including optical elements that are configured to direct a laser beam relative to the first and the second stages and configured (i) to direct the laser beam in a direction substantially on and parallel to the first axis and (ii) to measure a position of the object carrier.

2. The system according to claim 1 wherein the laser metrology system is further configured to direct the laser beam through the structural support member.

3. The system according to claim 1 wherein the second stage includes an X-stage and a Y-stage and wherein the laser metrology system includes optical elements that direct the laser beam to measure a position of the object carrier in respective X- and Y-axes.

4. The system according to claim 1 further including at least one Z-control mechanism that moves the first stage in a Z-axis direction and wherein the laser metrology system is adapted to direct the laser beam in a direction substantially on and parallel to the first axis for all first stage positions on the Z-axis.

5. A system for positioning an object, comprising:
a structural support member;
a first stage including (i) at least one rotational element coupled to the structural support member and (ii) a frame coupled to the at least one rotational element operable to rotate about a first axis through use of the at least one rotational element;
a second stage coupled to the first stage, the second stage having an object carrier adapted to move an object in a second axis, and an aggregate center of gravity of the first stage and the second stage is within 1 inch of the first axis; and
a laser metrology system including optical elements that are configured to direct a laser beam relative to the first and the second stages and configured (i) to direct the laser beam in a direction substantially on and parallel to the first axis and (ii) to measure a position of the object carrier.

6. The system according to claim 1 wherein the first stage includes a first rotational element and a second rotational element, and wherein the first rotational element is fixedly coupled to the structural support member and the second rotational element is variably coupled to the structural support member.

7. The system according to claim 1 wherein the first stage is adapted to rotate greater than one degree.

8. The system according to claim 1 further including an immobilization mechanism coupled to the first stage to restrict motion of the first stage.

9. The system according to claim 1 further including an alignment sensor adapted to detect an orientation of the object on the object carrier.

10. The system according to claim 1 further including at least one motion control processor coupled to the second stage that causes the second stage to move in a desired manner and wherein the at least one motion control processor receives feedback of the position of the object carrier from the laser metrology system.

11. The system according to claim 10 further including at least one other metrology system to measure a position of the object carrier or object, and wherein the at least one motion control processor receives feedback from the at least one other metrology system for use in controlling the position of the object carrier or object.

12. The system according to claim 1 further comprising an interface to communicate position information with a system selected from the group consisting of: an electron beam system, vacuum chamber, ion beam system, laser beam system, automated manufacturing process, and any combination thereof.

13. A method of positioning an object, comprising:
directing a laser beam relative to first and second stages and in a direction substantially on and parallel to a first axis about which the first stage rotates;
measuring, through use of the laser beam, a position of an object carrier of the second stage, coupled to the first stage, adapted to move an object in a second axis; and
providing measurement information associated with the position of the object carrier.

14. The method according to claim 13 wherein directing the laser beam includes directing the laser beam through a structural support member to which the first stage is coupled.

15. The method according to claim 13 wherein measuring the position of the object carrier includes measuring the position of the object carrier in X- and Y-axes.

16. The method according to claim 13 further including moving the first stage in a Z-axis direction and wherein measuring the position of the object carrier includes directing the laser beam in a direction substantially on and parallel to the first axis for all first stage positions on the Z-axis.

17. A method of positioning an object, comprising:
directing a laser beam relative to first and second stages and in a direction substantially on and parallel to a first axis about which the first stage rotates;
measuring, through use of the laser beam, a position of an object carrier of the second stage, coupled to the first stage, adapted to move an object in a second axis, and an aggregate center of gravity of the first stage and the second stage is within 1 inch of the first axis; and
providing measurement information associated with the position of the object carrier.

18. The method according to claim 13 further including adjusting a coupling of the first stage to a structural support member at one of two locations at which the first stage is coupled to the structural support member.

19. The method according to claim 13 further including rotating the first stage greater than one degree.

20. The method according to claim 13 further including immobilizing the first stage to restrict motion of the first stage.

21. The method according to claim 13 further including detecting an orientation of the object on the object carrier.

22. The method according to claim 13 further including feeding back a position of the object carrier and causing the second stage to move in a desired manner based on feedback of the position of the object carrier.

23. The method according to claim 22 further including measuring a position of the object carrier or object separate from the feeding back of the position of the object carrier and controlling the position of the object carrier or object based on the measured position.

24. The method according to claim 13 further comprising communicating position information with a system selected from the group consisting of: an electron beam system, vacuum chamber, ion beam system, laser beam system, automated manufacturing process, and any combination thereof.

25. A system for positioning an object, comprising:
means for directing a laser beam in a direction substantially on and parallel to a first axis about which a first stage rotates; and
means for measuring, through use of the laser beam, a position of an object carrier of a second stage, coupled to the first stage, adapted to move an object in a second axis.

* * * * *